(12) United States Patent
Grumbine

(10) Patent No.: US 6,830,503 B1
(45) Date of Patent: Dec. 14, 2004

(54) CATALYST/OXIDIZER-BASED CMP SYSTEM FOR ORGANIC POLYMER FILMS

(75) Inventor: Steven K. Grumbine, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 66 days.

(21) Appl. No.: 10/368,275

(22) Filed: Feb. 18, 2003

Related U.S. Application Data

(63) Continuation of application No. 10/044,376, filed on Jan. 11, 2002, now abandoned.

(51) Int. Cl.$^7$ ................................................. B24B 1/00
(52) U.S. Cl. ............................. 451/41; 451/28; 51/307
(58) Field of Search ............... 451/41, 28; 51/307–309; 106/6; 252/79.1; 438/692–693; 216/97, 99, 100

(56) References Cited

U.S. PATENT DOCUMENTS

| | | |
|---|---|---|
| 5,489,233 A | 2/1996 | Cook et al. |
| 5,527,423 A | 6/1996 | Neville et al. |
| 5,958,794 A | 9/1999 | Bruxvoort et al. |
| 5,972,124 A * | 10/1999 | Sethuraman et al. ........... 134/7 |
| 5,980,775 A | 11/1999 | Grumbine et al. |
| 6,068,787 A | 5/2000 | Grumbine et al. |
| 6,177,026 B1 | 1/2001 | Wang et al. |
| 6,242,351 B1 | 6/2001 | Li et al. |
| 6,270,395 B1 | 8/2001 | Towery et al. |
| 6,280,490 B1 | 8/2001 | Rader et al. |
| 6,435,943 B1 * | 8/2002 | Chang et al. .................. 451/28 |
| 6,435,944 B1 * | 8/2002 | Wang et al. .................... 451/41 |
| 6,736,992 B2 * | 5/2004 | Zhang et al. ............... 252/79.1 |

FOREIGN PATENT DOCUMENTS

| | | |
|---|---|---|
| WO | WO 99/53532 A1 | 10/1999 |
| WO | WO 00/49647 A1 | 8/2000 |

OTHER PUBLICATIONS

Borst et al., Journal of the Electrochemical Society, vol. 146, No. 11, pp. 4309–4315 (1999).
Borst et al., Proceedings of the 4$^{th}$ International Conference on CMP Planarization, pp. 409–412 (Feb. 11–12, 1999).
Kuchenmeister et al. Proceedings of Advanced Metallization Conference, pp. 237–242 (Oct. 6–8, 1998).
Neirynck et al., Thin Solid Films, vol. 290–291, pp. 447–452 (1996).
Yang et al., Journal of the Electrochemical Society, vol. 144, No. 9, pp. 3249–3255.

* cited by examiner

*Primary Examiner*—George Nguyen
(74) *Attorney, Agent, or Firm*—Caryn Borg-Breen

(57) ABSTRACT

The invention is directed to a method of polishing a substrate comprising (i) providing a substrate comprising an organic polymer film, (ii) contacting the substrate with a chemical-mechanical polishing system comprising a liquid carrier, an abrasive and/or polishing pad, a peroxy-type oxidizer, and a metal compound with two or more oxidation states, wherein the metal compound is soluble in the liquid carrier, and (iii) abrading at least a portion of the substrate to polish the substrate.

19 Claims, No Drawings

CATALYST/OXIDIZER-BASED CMP SYSTEM FOR ORGANIC POLYMER FILMS

This application is a continuation of Ser. No. 10/044,376 filed Jan. 11, 2002 abandoned.

FIELD OF THE INVENTION

This invention pertains to a chemical-mechanical polishing system and method for polishing organic polymer films.

BACKGROUND OF THE INVENTION

Compositions and methods for planarizing or polishing the surface of a substrate are well known in the art. Polishing compositions (also referred to as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing composition comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No 5,958,794 discloses a fixed abrasive polishing pad.

Polishing compositions for silicon-based intermetal dielectric layers have been particularly well developed in the semiconductor industry and the chemical and mechanical nature of polishing and wear of the silicon-based dielectrics is reasonably well understood. One problem with the silicon-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which the circuit can operate. Strategies being developed to reduce the capacitance include (1) incorporating metals with lower resistivity values (e.g., copper), and (2) providing electrical isolation with insulating materials having lower dielectric constants relative to silicon. Such low dielectric constant materials typically include organic polymer materials, inorganic and organic porous dielectric materials, and blended or composite organic and inorganic materials, which can be porous or non-porous. It would be highly desirable to incorporate low dielectric constant materials into semiconductor structures while still being able to utilize the conventional chemical-mechanical polishing (CMP) systems for polishing the surface of the resulting dielectric material during the semiconductor wafer processing.

Organic polymer materials typically have a dielectric constant value of about 3 or less. Organic polymer materials include polymers with a relatively high organic content, polymers with a low and high organic content with a high level of porosity, polymers with relatively low organic content based upon silicon-oxygen type materials and inorganic materials, or can be polymers with a combination of these properties. Such organic polymer dielectric materials have unique chemical and mechanical characteristics that must be addressed during chemical-mechanical polishing. Organic polymer materials generally are mechanically soft and readily exhibit plastic deformation, which makes them easy to scratch. In contrast to their mechanical sensitivity, however, organic polymers are often chemically inert. The combination of these chemical and mechanical characteristics makes organic polymer dielectric materials difficult to polish using a traditional aqueous based CMP system.

Several chemical-mechanical polishing systems have been used for the polishing of organic polymer materials. Neirynck et al. (*Thin Solid Films*, 290–291, 447–452 (1996)) discloses polishing compositions comprising alumina abrasive, either nitric acid or ammonium hydroxide, Triton-X, and optionally benzotriazole (BTA). Yang et al. (*J. Electrochem. Soc.*, 144, 3249–3255 (1997)) discloses a polishing composition for benzocyclobutene (BCB) and parylene N (PA-N) films comprising nitric acid or ammonium hydroxide, alumina abrasive, optionally Triton-X, and water. Kuchenmeister et al. (*Procedings of the Advanced Metallization Conference in* 1998, 237–242 (November 1998)) discloses a CMP polishing composition for SiLK and BCB dielectric materials comprising alumina and an organic acid salt. Borst et al (*Proceedings of the 4$^{th}$ International Conference on CMP Planarization* (CMP-MIC), 409–412 (February 1999)) discloses CMP compositions for BCB and SiLK dielectric materials comprising alumina, water, nitric acid, organic surfactants, and optionally benzotriazole, and comprising alumina, water, and hydrogen peroxide. Borst et al. (*J. Electrochem. Soc.*, 146, 4309 (1999)) discloses CMP compositions for BCB and SiLK dielectric materials comprising water, nitric acid, a surfactant, alumina abrasive, and hydrogen peroxide. U.S. Pat. No. 6,270,395 (Towery et al.) discloses a polishing composition comprising non-oxidizing abrasive particles in combination with a separate oxidizing agent, oxidizing particles alone, or reducible abrasive particles in combination with a compatible oxidizing agent.

A need remains, however, for a polishing system and polishing method that will exhibit desirable planarization efficiency, uniformity, and removal rate during the polishing and planarization of substrates containing organic polymer materials, while minimizing defectivity, such as surface imperfections and damage to underlying structures and topography during polishing and planarization. The invention provides such a polishing system and method. These and other advantages of the invention, as well as additional inventive features, will be apparent from the description of the invention provided herein.

BRIEF SUMMARY OF THE INVENTION

The invention provides a method for polishing a substrate comprising (i) providing a substrate comprising an organic polymer film, (ii) contacting the substrate with a chemical-mechanical polishing system comprising (a) a liquid carrier, (b) an abrasive and/or polishing pad, (c) a peroxy-type oxidizer, and (d) a metal compound with two or more oxidation states, wherein the metal compound is soluble in the liquid carrier, and (iii) abrading at least a portion of the substrate to polish the substrate.

DETAILED DESCRIPTION OF THE INVENTION

The invention is directed to a method of polishing a substrate containing an organic polymer film. The substrate comprising an organic polymer film is contacted with a chemical-mechanical polishing system. The CMP system comprises (a) a liquid carrier, (b) an abrasive and/or polishing pad, (c) a peroxy-type oxidizer, and (d) a metal compound with two or more oxidation states, wherein the metal compound is soluble in the liquid carrier. At least a portion of the substrate then is abraded to polish the substrate. The abrasive (when present and suspended in the liquid carrier), peroxy-type oxidizer, metal compound, and liquid carrier, as well as any other components suspended in the liquid carrier, form the polishing composition of the CMP system.

The chemical-mechanical polishing system comprises an abrasive, a polishing pad, or both. Preferably, the CMP system comprises both an abrasive and a polishing pad. The abrasive can be any suitable abrasive. The abrasive can be fixed on the polishing pad and/or can be in particulate form and suspended in the liquid carrier. The polishing pad can be any suitable polishing pad.

The abrasive can be any suitable abrasive. For example, the abrasive particles can be natural or synthetic and can include diamond (e.g., polycrystalline diamond), garnet, glass, carborundum, metal oxide (e.g., silica, fumed alumina, fused alumina, ceramic alumina, chromia, and iron oxide), polymer, and the like. The abrasive also can be coated particles or polymer/metal oxide composite particles. When the abrasive is a metal oxide abrasive, it preferably is selected from the group consisting of alumina, silica, titania, ceria, zirconia, germania, magnesia, co-formed products thereof, and combinations thereof. The choice of abrasive will depend on the mechanical characteristics of the organic polymer film being polished. For example, if the organic polymer film is particularly susceptible to scratching, softer abrasive particles (e.g., silica and polymer particles) are preferred.

When the abrasive is present in the CMP system and is suspended in the liquid carrier (i.e., when the abrasive is a component of the polishing composition), any suitable amount of abrasive can be present in the polishing composition. Typically, about 0.1 wt. % or more (e.g., about 0.5 wt. % or more) abrasive will be present in the polishing composition. More typically, about 1 wt. % or more abrasive will be present in the polishing composition. The amount of abrasive in the polishing composition typically will not exceed about 30 wt. %, more typically will not exceed about 20 wt. % (e.g., will not exceed about 10 wt. %).

The polishing composition employs a peroxy-type oxidizer in conjunction with a soluble metal salt or metal ligand complex. The peroxy-type oxidizer is any oxidizer with at least one peroxy (—O—O—) group. For example, the peroxy-type oxidizer is an organic peroxide, inorganic peroxide, or combination thereof. Examples of compounds containing at least one peroxy group include but are not limited to hydrogen peroxide and its adducts such as urea hydrogen peroxide and percarbonates (e.g., sodium percarbonate), organic peroxides such as benzoyl peroxide, peracetic acid, perboric acid, and di-tert-butyl peroxide, monopersulfates ($SO_5^{2-}$), dipersulfates ($S_2O_8^{2-}$), and sodium peroxide. The peroxy-type oxidizer preferably is hydrogen peroxide.

The metal compound is a metal salt or a metal ligand complex having two or more oxidation states. The phrase "two or more oxidation states" refers to an atom and/or compound that has a valence number that is capable of being augmented as the result of a loss of one or more negative charges in the form of electrons. The metal compound desirably contains a metal selected from the group consisting of Ag, Co, Cr, Cu, Fe, Mo, Mn, Nb, Ni, Os, Pd, Ru, Ti, V, and Ce. Preferrred metal compounds include iron and copper compounds of formula MX, $MX_2$, $MX_3$, or $M_2X_3$ where M is Fe or Cu and X is selected from the group consisting of nitrate, fluoride, chloride, bromide, iodide, sulfate, phosphate, acetate, oxalate, acetylacetonate, citrate, tartrate, malonate, gluconate, phthalate, succinate, perchlorate, perbromate, and periodate. While not wishing to be bound to any particular theory, the combination of the peroxyoxidizer and reduced metal complex promotes the in situ generation of .OH or .OR radicals (i.e., Fenton's chemistry), which efficiently oxidize C—X bonds (where X is H, C, N, O, S, etc.) of organic polymer films. Thus, the soluble metal compound can be any metal compound capable of promoting homolytic cleavage of a peroxide bond to generate .OH or .OR radicals.

The metal compound is soluble in the liquid carrier. By "soluble" is meant that the metal compound has a solubility in the liquid carrier of at least 1 μg/1 mL or more (i.e. at least 1 μg of metal compound dissolves completely in 1 mL of liquid carrier).

Typically, about 0.1 wt. % to about 20 wt. % peroxy-type oxidizer, based on the weight of the liquid carrier and any compounds dissolved or suspended therein, is present in the chemical-mechanical polishing system. Typically, about 0.02 M or less (e.g., about 0.01 M or less, or about 0.005 M or less) metal compound is present in the chemical-mechanical polishing system. The amount of metal compound in the chemical-mechanical polishing system may vary with the type of oxidizer used. Preferably, about $4 \times 10^{-5}$ M or more (e.g., about $4 \times 10^{-5}$ M to about $4 \times 10^{-3}$ M) metal compound is present in the chemical-mechanical polishing system.

A liquid carrier is used to facilitate the application of the abrasive (when present), peroxy-type oxidizer, and metal compound to the surface of a suitable substrate to be polished or planarized. The liquid carrier can be any suitable liquid carrier. Preferably, the liquid carrier comprises, consists essentially of, or consists of water, more preferably deionized water.

The pH of the chemical-mechanical polishing system of the invention is maintained in a range suitable for its intended end-use. The CMP system desirably has a pH in the range of about 2 to about 12 depending on the type of substrate being polished. Typically the CMP system will have a pH of about 2 to about 8, although for certain organic polymer films, a pH of about 8 to about 12 may be desirable.

Other polishing composition additives may be incorporated into the chemical-mechanical polishing system, many of which are well known in the art. For example, the polishing system may farther comprise inorganic acids, organic acids, surfactants, alkylammonium salts or hydroxides, and dispersing agents.

An additive, which may be particularly useful with this invention, is one that stabilizes the oxidizer in the presence of the metal compound. It is well known that peroxy-type oxidizers like hydrogen peroxide are not stable in the presence of many metal ions without the use of stabilizers. For this reason, the polishing composition may include a stabilizer to prevent degradation of the peroxy-type oxidizer over time. The addition of a stabilizer to the polishing composition reduces the effectiveness of the metal compound; therefore, the choice of the type and amount of stabilizer is important to CMP performance.

Useful stabilizers include phosphoric acid, organic acids (e.g., carboxylic acids and dicarboxylic acids), phosphonic acids, nitrites, and other ligands, which bind to the metal and reduce its reactivity toward peroxy-type oxidizers. The acid stabilizers can be used in their conjugate base form (e.g., carboxylates, phosphates, and phosphonates). Stabilizers can be used singly or in combination and significantly decrease the rate at which peroxy-type oxidizers decompose. Preferred stabilizers include phosphoric acid, phthalic acid, citric acid, adipic acid, oxalic acid, malonic acid, benzonitrile, conjugate bases thereof, and mixtures thereof. Suitable phosphonic acids include aminotrimethylenephosphonic acid, 1-hydroxyethylidene-4-diphosphonic acid, hexamethylenediaminetetramethylene phosphonic acid, and diethylenetetramine pentamethylenephosphonic acid. A preferred phosphonic acid stabilizer is aminotrimethylene phosphonic acid. The amount of stabilizer present in the polishing composition desirably is about one equivalent or more per metal ion. Preferably, the amount of stabilizer is about 5 wt. % or less (more preferably, about 3 wt. % or less). A preferred chemical-mechanical polishing system comprises about 0.5 wt. % to about 4 wt. % hydrogen peroxide, about $4 \times 10^{-4}$ M to about $4 \times 10^{-3}$ M copper salt, and a dicarboxylic acid stabilizer.

In order to promote stabilization of the polishing composition against settling, and flocculation, a variety of optional additives, such as surfactants or dispersing agents, can be used. If a surfactant is added to the CMP slurry, then it can be an anionic, cationic, nonionic, or amphoteric surfactant, or a combination of two or more surfactants can be employed. Furthermore, it has been found that the addition of a surfactant may be useful to improve the within-wafer-non-uniformity (WIWNU of wafers polished with the CMP system, thereby improving the surface of the wafer and reducing wafer defects.

In general, the amount of additive, such as a surfactant, in the polishing composition should be sufficient to achieve effective stabilization of the polishing composition and typically will vary depending on the particular surfactant selected and the nature of the surface of the abrasive. For example, if not enough of a selected surfactant is used, it will have little or no effect on stabilization. Too much surfactant in the polishing composition, however, may result in undesirable foaming and/or flocculation in the polishing composition. As a result, surfactants generally should be present in an amount of about 0.001 wt. % to about 10 wt. %. Furthermore, the additive can be added directly to the polishing composition or indirectly by treating the surface of the abrasive with the additive. In either case, the amount of additive is adjusted to achieve the desired concentration in the polishing composition.

The chemical-mechanical polishing system optionally further can be exposed to UV irradiation during the chemical-mechanical polishing process. UV irradiation is known to promote the homolysis reaction in peroxy-type oxidizers. Broadband UV radiation in the wavelength range of 180–600 nm can be used, as can narrower band sources. Suitable UV radiation sources include Hg and Xenon lamps. The UV radiation can be pulsed or continuous.

The substrate to be polished comprises at least one organic polymer film. Suitable substrates include semiconductors, MEMS (microelectromechanical systems), optical waveplates, and substrates comprising anti-reflective coatings (ARC). The organic polymer film typically will have a dielectric constant of about 3.5 or less (e.g., about 3 or less, such as about 1 to about 3). Suitable organic polymer films can comprise a polymer selected from the group consisting of polyimide, fluorinated polyimide, polyarylenes and polyarylene ethers (such as SiLK™ from Dow Chemical, FLARE™ from Allied Signal, and VELOX™ from Schumacher), polybenzocyclobutene, divinyl siloxane bisbenzocyclobutene (DVS-BCB), polytetrafluoroethylene (PTFE), polysiloxane, polynaphthylene ether, polyquinolines, paralynes (such as Parylene AF4, an aliphatic tetrafluorinated poly-p-xylylene), copolymers thereof, and combinations thereof. The substrate optionally further can comprise one or more metal layers, especially metal layers comprising copper, tantalum, tungsten, titanium, platinum, ruthenium, iridium, aluminum, nickel, or combinations thereof.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for polishing a substrate comprising:
   (i) providing a substrate comprising an organic polymer film,
   (ii) contacting the substrate with a chemical-mechanical polishing system comprising:
      (a) a liquid carrier,
      (b) an abrasive and/or polishing pad,
      (c) a peroxy-type oxidizer, and
      (d) a metal compound with two or more oxidation states, wherein the metal compound is soluble in the liquid carrier, and
   (iii) abrading at least a portion of the substrate to polish the substrate.

2. The method of claim 1, wherein the organic polymer film has a dielectric constant of about 3.5 or less.

3. The method of claim 2, wherein the organic polymer film comprises a polymer selected from the group consisting of polyimide, polyarylene, polybenzocyclobutene, polytetrafluoroethylene, polysiloxane, copolymers thereof, and combinations thereof.

4. The method of claim 2, wherein the peroxy-type oxidizer is selected from the group consisting of organic peroxides, inorganic peroxides, and mixtures thereof.

5. The method of claim 2, wherein about 0.1 wt. % to about 20 wt. % peroxy-type oxidizer, based on the weight of the liquid carrier and any compounds dissolved or suspended therein, is present in the chemical-mechanical polishing system.

6. The method of claim 2, wherein the metal compound is a metal salt or a metal ligand complex.

7. The method of claim 6, wherein the metal compound is an iron compound or copper compound of formula MX, $MX_2$, $MX_3$, or $M_2X_3$ where M is Fe or Cu and X is selected from the group consisting of nitrate, fluoride, chloride, bromide, iodide, sulfate, phosphate, acetate, oxalate, acetylacetonate, citrate, tartrate, malonate, gluconate, phthalate, succinate, perchlorate, perbromate, and periodate.

8. The method of claim 7, wherein about 0.02 M or less metal compound is present in the chemical-mechanical polishing system.

9. The method of claim 8, wherein the chemical-mechanical polishing system comprises an abrasive.

10. The method of claim 9, wherein the abrasive is a metal oxide selected from the group consisting of alumina, silica, titania, ceria, zirconia, germania, magnesia, co-formed products thereof, and combinations thereof.

11. The method of claim 2, wherein the chemical-mechanical polishing system comprises an abrasive, and the abrasive is fixed on a polishing pad.

12. The method of claim 2, wherein the chemical-mechanical polishing system comprises an abrasive, and the abrasive is in particulate form and is suspended in the liquid carrier.

13. The method of claim 12, wherein the abrasive is silica or a polymer abrasive.

14. The method of claim 2, wherein the liquid carrier is water.

15. The method of claim 2, wherein the chemical-mechanical polishing system further comprises a surfactant.

16. The method of claim 2, wherein the chemical-mechanical polishing system further comprises a stabilizer.

17. The method of claim 16, wherein the stabilizer is selected from the group consisting of phosphoric acid, phthalic acid, citric acid, adipic acid, oxalic acid, malonic acid, benzonitrile, and mixtures thereof.

18. The method of claim 16, wherein about one equivalent or more of the stabilizer, based on the metal compound, is present in the chemical-mechanical polishing system.

19. The method of claim 16, wherein the polishing system comprises about 0.5 wt. % to about 4 wt. % hydrogen peroxide, about $4\times10^{-4}$ M to about $4\times10^{-3}$ M copper salt, and a dicarboxylic acid stabilizer.

* * * * *